United States Patent
Liu et al.

(10) Patent No.: US 7,256,716 B2
(45) Date of Patent: *Aug. 14, 2007

(54) DATA ENCODING AND DECODING USING SLEPIAN-WOLF CODED NESTED QUANTIZATION TO ACHIEVE WYNER-ZIV CODING

(75) Inventors: Zhixin Liu, College Station, TX (US);
Samuel S. Cheng, Houston, TX (US);
Angelos D. Liveris, Stafford, TX (US);
Zixiang Xiong, Spring, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/068,737

(22) Filed: Mar. 1, 2005

(65) Prior Publication Data

US 2006/0197686 A1    Sep. 7, 2006

(51) Int. Cl.
*H03M 7/34* (2006.01)
(52) U.S. Cl. .............................. 341/51; 341/56; 341/67
(58) Field of Classification Search .................. 341/51, 341/50, 56, 67, 107
See application file for complete search history.

(56) References Cited

U.S. PATENT DOCUMENTS

| 4,084,137 A * | 4/1978 | Welti .......................... 375/260 |
| 6,263,029 B1 * | 7/2001 | Alard et al. ................. 375/340 |
| 6,441,764 B1 * | 8/2002 | Barron et al. ............... 341/155 |
| 2002/0176494 A1 * | 11/2002 | Zhao et al. .................. 375/240 |
| 2006/0048038 A1 * | 3/2006 | Yedidia et al. .............. 714/793 |

OTHER PUBLICATIONS

U.S. Appl. No. 11/086,778, filed on Mar. 22, 2005.*
Yang Yang et al. "Wyner-Ziv Coding Based on TCQ and LDPC Codes" 2003, IEEE (pp. 825-826).*
Aaron D. Wyner and Jacob Ziv; "The Rate-Distortion Function for Source Coding with Side Information at the Decoder"; IEEE Transactions on Information Theory; Jan. 1976; pp. 1-10; vol. IT-22, No. 1.
A. D. Wyner; "The Rate-Distortion Function for Source Coding with Side Information at the Decoder-II: General Sources", Information and Control; 1978; pp. 60-80; vol. 38, no month.
Sergio D. Servetto; "Lattice Quantization with Side Information," Data Compression Conference Proceedings; 2000; pp. 1-10, no month.
Xin Wang and Michael T. Orchard; "Design of Trellis Codes for Source Coding with Side Information at the Decoder"; Data Compression Conference Proceedings; 2001; pp. 361-370, no month.
Patrick Mitran and Jan Bajcsy; "Coding for the Wyner-Ziv Problem with Turbo-Like Codes," IEEE International Symposium on Information Theory; Jun./Jul. 2002; p. 91.

(Continued)

*Primary Examiner*—Linh V. Nguyen

(57) ABSTRACT

A system and method for realizing a Wyner-Ziv encoder may involve the following steps: (a) applying nested quantization to input data from an information source in order to generate intermediate data; and (b) encoding the intermediate data using an asymmetric Slepian-Wolf encoder in order to generate compressed output data representing the input data. Similarly, a Wyner-Ziv decoder may be realized by applying an asymmetric Slepian-Wolf decoder to compressed input data (representing samples of a first source) to obtain intermediate values, and then, jointly decoding the intermediate values using side information (samples of a second source having known correlation with respect to the first source).

9 Claims, 6 Drawing Sheets

--- apply nested quantization to input data from an information source in order to generate intermediate encoded data  410 encode the intermediate data using an asymmetric Slepian-Wolf encoder in order to generate compressed output data representing the input data  420

OTHER PUBLICATIONS

Anne Aaron, Rui Zhang and Bernd Girod; "Wyner-Ziv Coding of Motion Video"; Conference Record of the 36th Asilomar Conference on Signals, Systems and Computers; Nov. 2002; pp. 240-241; vol. 1.

S. Sandeep Pradhan and Kannan Ramchandran; "Distibuted Source Coding Using Syndromes (DISCUS): Design and Construction"; IEEE Transactions on Information Theory; Mar. 2003; pp. 626-643; vol. 49, No. 3.

David Rebollo-Monedero, Rui Zhang, and Bernd Girod; "Design of Optimal Quantizers for Distributed Source Coding"; Data Compression Conference Proceedings; Mar. 2003; pp. 13-22.

Jim Chou, S. Sandeep Pradhan, and Kannan Ramchandran; "Turbo and Trellis-Based Constructions for Source Coding with Side Information"; Data Compression Conference Proceedings; Mar. 2003; pp. 33-42.

Angelos Liveris, Zixiang Xiong and Costas N. Georghiades; "Nested Convolutional/Turbo Codes for the Binary Wyner-Ziv Problem," International Conference on Image Processing Proceedings; Sep. 2003; pp. I-601-I-604; vol. 1.

Zixiang. Xiong, Angelos D. Liveris, Samuel Cheng, and Zhixin Liu; "Nested Quantization and Slepian-Wolf Coding: A Wyner-Ziv Coding Paradigm for I.I.D. Sources"; IEEE Workshop on Statistical Signal Processing; Sep./Oct. 2003; pp. 399-402.

Yang Yang, Samuel Cheng, Zixiang Xiong, and Wei. Zhao; "Wyner-Ziv Coding Based on TCQ and LDPC Codes"; Conference Record of the 37th Asilomar Conference on Signals, Systems and Computers; Nov. 2003; pp. 825-829; vol. 1.

Zhixin Liu, Samuel Cheng, Angelos Liveris, and Zixiang Xiong; "Slepian-Wolf Coded Nested Quantization (SWC-NQ) for Wyner-Ziv Coding: Performance Analysis and Code Design," Data Compression Conference Proceedings; Mar. 2004; pp. 322-331.

Gottfried Ungerboeck; "Channel Coding with Multilevel/Phase Signals"; IEEE Transactions on Information Theory; Jan. 1982; pp. 55-67; vol. IT-28, No. 1.

Michael W. Marcellin and Thomas R. Fischer; "Trellis Coded Quantization of Memoryless and Gauss-Markov Sources"; IEEE Transactions on Communications; Jan. 1990; pp. 82-93; vol. 38, No. 1.

Ram Zamir and Shlomo Shamai, "Nested Linear/Lattice Codes for Wyner-Ziv Encoding"; Information Theory Workshop; Jun. 1998; pp. 92-93.

J. H. Conway, E. M. Rains and N. J. A. Sloane; "On the Existence of Similar Sublattices"; Canadian Journal of Mathematics; 1999; pp. 1300-1306; vol. 51, No. 6, no month.

Ram Zamir, Shlomo Shamai, and Uri Erez; "Nested Linear/Lattice Codes for Structured Multiterminal Binning"; IEEE Transactions on Information Theory; Jun. 2002; pp. 1250-1276: vol. 48, No. 6.

M. Vedat Eyuboglu and G. David Forney, Jr.; "Lattice and Trellis Quantizations with Lattice- and Trellis-Bounded Codebooks- High-Rate Theory for Memoryless Sources"; IEEE Transactions on Information Theory; Jan. 1993; pp. 46-59; vol. 39, No. 1.

David J. C. Mackay; "Good Error-Correcting Codes Based on Very Sparse Matrices"; IEEE Transactions on Information Theory; Mar. 1999; pp. 399-431; vol. 45, No. 2.

D. J. C. Mackay and R. M. Neal; "Near Shannon limit performance of low density parity check codes"; Electronics Letters; Mar. 13, 1997; pp. 457-458; vol. 33, No. 6.

David Rebollo-Monedero, Anne Aaron, and Bernd Girod "Transforms for High-Rate Distributed Source Coding"; Conference Record of the 37th Asilomar Conference on Signals, Systems and Computers; Nov. 2003; pp. 850-854; vol. 1.

David Slepian and J.K. Wolf; "Noiseless Coding of Correlated Information Sources"; IEEE Transactions on Information Theory; Jul. 1973; pp. 471-480; vol. 19.

Ram Zamir; "The Rate Loss in the Wyner-Ziv Problem"; IEEE Transactions on Information Theory; Nov. 1996; pp. 2073-2084; vol. 42, No. 6.

Vahid Tarokh, Alexander Vardy, and Kenneth Zeger; "Universal Bound on the Performance of Lattice Codes," IEEE Transactions on Information Theory, Mar. 1999; pp. 670-681; vol. 45, No. 2.

Lori A. Dalton; "Analysis of 1-D Nested Lattice Quantization and Slepian-Wolf Coding for Wyner-Ziv Coding of i.i.d. Sources", Project report for ELEN 663, Texas A&M University, May 2003.

G. David Forney, Jr.; "Coset Codes—Part II: Binary Lattices and Related Codes"; IEEE Transactions on Information Theory; Sep. 1988; pp. 1152-1187; vol. 34, No. 5.

Angelos Liveris, Zixiang Xiong and Costas N. Georghiades; "Compression of Binary Sources With Side Information at the Decoder Using LDPC Codes," IEEE Communications Letters; Oct. 2002; pp. 440-442, vol. 6, No. 10.

* cited by examiner

DATA ENCODING AND DECODING USING SLEPIAN-WOLF CODED NESTED QUANTIZATION TO ACHIEVE WYNER-ZIV CODING

The U.S. Government has a paid-up license in this invention and the right in limited circumstances to require the patent owner to license others on reasonable terms as provided for by the terms of grant number CCR-01-04834 awarded by the National Science Foundation (NSF).

FIELD OF THE INVENTION

The present invention relates to the field of information coding/decoding, and more particularly to a system and method for Slepian-Wolf coded nested quantization for Wyner-Ziv coding, e.g., for use in distributed source encoding/decoding.

DESCRIPTION OF THE RELATED ART

Issues related to distributed compression of correlated sources are relevant for a wide variety of applications, such as distributed sensor networks and multi-source video distribution, both wired and wireless, coding for relay channels, and digital communications, among others. Distributed source coding (DSC), whose theoretical foundation was laid by Slepian and Wolf as early as 1973 (see D. Slepian and J. K. Wolf, "Noiseless coding of correlated information sources," *IEEE Trans. On Information Theory*, vol. IT-19, pp. 471-480, July 1973.), refers to the compression of the outputs of two or more physically separated sources that do not communicate with each other (hence distributed coding). These sources send their compressed outputs to a central point (e.g., the base station) for joint decoding. DSC is related to the well-known "CEO problem" (in which a source is observed by several agents, who send independent messages to another agent (the chief executive officer (CEO)), who attempts to recover the source to meet a fidelity constraint, where it is usually assumed that the agents observe noisy versions of the source, with the observation noise being independent from agent to agent), and is part of network information theory.

The Wyner-Ziv coding problem deals with source coding with side information under a fidelity criterion. Although the theoretical limits for this problem have been known for some time (see, e.g., A. Wyner and J. Ziv, "The rate-distortion function for source coding with side information at the decoder," IEEE Trans. Inform. Theory, vol. 22, pp. 1-10, January 1976; and A. Wyner, "The rate-distortion function for source coding with side information at the decoder-II: general sources", Inform. Contr., vol. 38, pp. 60-80, 1978.), practical approaches to Wyner-Ziv coding have only recently been determined (see, e.g., S. Servetto, "Lattice quantization with side information," Proc. DCC'00, Snowbird, Utah, March 2000; X. Wang and M. Orchard, "Design of trellis codes for source coding with side information at the decoder," Proc. DC'01, Snowbird, Utah, March 2001; P. Mitran, and J. Bajcsy, "Coding for the Wyner-Ziv problem with turbo-like codes," Proc. ISIT'02, Lausanne, Switzerland, June/July 2002; A. Aaron, R. Zhang and B. Girod, "Wyner-Ziv coding of motion video," Proc. 36th Asilomar Conf., Pacific Grove, Calif., November 2002; S. Pradhan and K. Ramchandran, "Distributed source coding using syndromes (DISCUS): Design and construction," IEEE Trans. Inform. Theory, vol. 49, pp. 626-643, March 2003; D. Rebollo-Monedero, R. Zhang, and B. Girod, "Design of optimal quantizers for distributed source coding," Proc. IEEE Data Compression Conference, Snowbird, Utah, April 2003; J. Chou, S. Pradhan, and K. Ramchandran, "Turbo and trellis-based constructions for source coding with side information," Proc. DCC'03, Snowbird, Utah, March 2003; A. Liveris, Z. Xiong and C. Georghiades, "Nested convolutional/turbo codes for the binary Wyner-Ziv problem," Proc. ICIP'03, Barcelona, Spain, September 2003; Z. Xiong, A. Liveris, S. Cheng, and Z. Liu, "Nested quantization and Slepian-Wolf coding: A Wyner-Ziv coding paradigm for i.i.d. sources," Proc. IEEE Workshop on Statistical Signal Processing, St.Louis, Mo., September 2003; and Y. Yang, S. Cheng, Z. Xiong, and W. Zhao "Wyner-Ziv coding based on TCQ and LDPC codes," Proc. 37th Asilomar Conf., Pacific Grove, Calif., November 2003.). Zamir et al. (see R. Zamir, S. Shamai, and U. Erez, "Nested linear/lattice codes for structured multiterminal binning," IEEE Trans. Inform. Theory, vol. 48, pp. 1250-1276, June 2002; and R. Zamir and S. Shamai, "Nested linear/lattice codes for Wyner-Ziv encoding," Proc. IEEE Information Theory Workshop, pp. 92-93, Killarney, Ireland, June 1998) first outlined some constructive mechanisms using a pair of nested linear/lattice codes for binary/Gaussian sources, where the fine code in the nested pair plays the role of source coding while the coarse code does channel coding. They also proved that, for the quadratic Gaussian case, the Wyner-Ziv rate-distortion (R-D) function is asymptotically achievable using nested lattice codes, with the assumption that the lattice is ideally sphere-packed as the lattice dimension goes to infinity. Servetto (see S. Servetto, "Lattice quantization with side information," Proc. DCC'00, Snowbird, Utah, March 2000) proposed explicit nested lattice constructions with the same dimensional lattice source codes and lattice channel codes. At low dimensions, the lattice channel coding component is not as strong as the lattice source coding component in the setup of Servetto. This is because, as the dimensionality increases, lattice source codes reach the R-D function much faster than lattice channel codes approach the capacity (see, e.g., V. Tarokh, A. Vardy, and K. Zeger, "Universal Bound on the performance of lattice codes," IEEE Trans. Inform. Theory, vol. 45, pp. 670-681, March 1999; and J. H. Conway and N. J. A. Sloane, Sphere Packings. Lattices and Groups, New York: Springer, 1998.), when measuring the gaps to the corresponding theoretical limits in dBs for the MSE and channel SNR, respectively.

Consequently, one needs channel codes of much higher dimensions than source codes to achieve the same loss in terms of the gap to the corresponding limit, and the Wyner-Ziv limit may be approached with nesting codes of different dimensions in practice (see R. Zamir, S. Shamai, and U. Erez, "Nested linear/lattice codes for structured multiterminal binning," IEEE Trans. Inform. Theory, vol. 48, pp. 1250-1276, June 2002).

SUMMARY OF THE INVENTION

In one set of embodiments, a system and method for realizing a Wyner-Ziv encoder may involve the following steps: (a) applying nested quantization to input data from an information source in order to generate intermediate data; and (b) encoding the intermediate data using an asymmetric Slepian-Wolf encoder in order to generate compressed output data representing the input data.

In another set of embodiments, a system and method for realizing a Wyner-Ziv decoder involves the following steps:
(a) receiving compressed input data representing a block of samples of a first source X;

(b) receiving a block of samples of a second source Y;

(c) applying an asymmetric Slepian-Wolf decoder to the compressed input data in order to generate a block of intermediate values; and (d) performing joint decoding on each intermediate value and a corresponding sample of the second source block to obtain a corresponding decompressed output value.

The joint decoding may include computing a centroid of a conditional probability density of the first source X given said corresponding sample of the second source block restricted to a region of space corresponding to the intermediate value. The centroid may determine the decompressed output value for the joint decoder.

BRIEF DESCRIPTION OF THE DRAWINGS

A better understanding of the present invention can be obtained when the following detailed description of the preferred embodiment is considered in conjunction with the following drawings, in which.

Figure 1A:
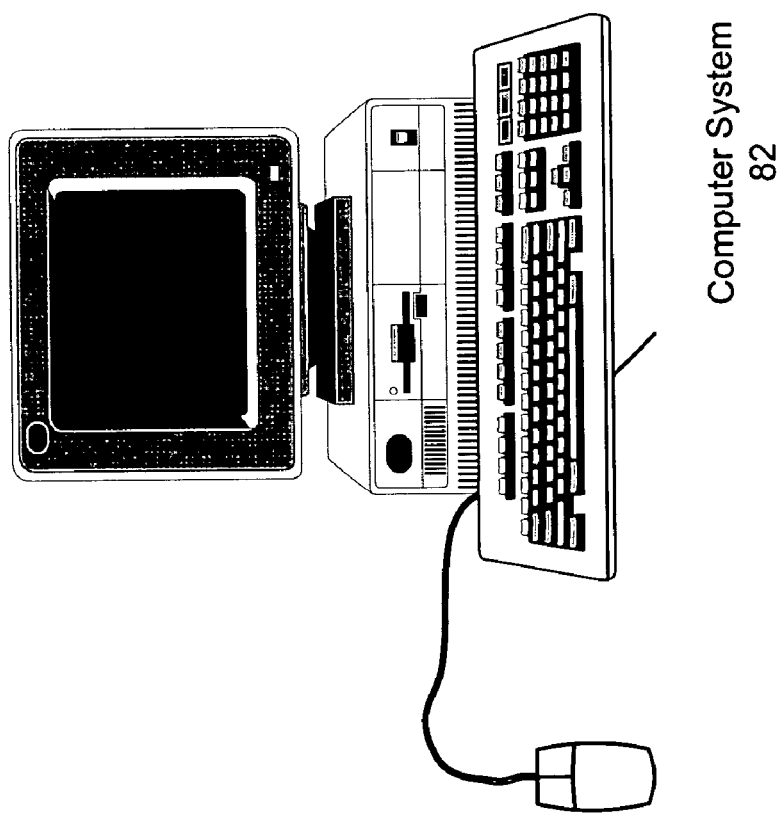
FIG. 1A illustrates a computer system suitable for implementing various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Provisional Application Ser. No. 60/657,520, titled "Multi-Source Data Encoding, Transmission and Decoding", filed Mar. 1, 2005, whose inventors are Vladimir M. Stankovic, Angelos D. Liveris, Zixiang Xiong, Costas N. Georghiades, Zhixin Liu, Samuel S. Cheng, and Qian Xu.

U.S. patent application Ser. No. 11/069,935, titled "Multi-Source Data Encoding, Transmission and Decoding Using Slepian-Wolf Codes Based On Channel Code Partitioning", filed Mar. 1, 2005, whose inventors are Vladimir M. Stankovic, Angelos D. Liveris, Zixiang Xiong, and Costas N. Georghiades.

A. Wyner and J. Ziv, "The rate-distortion function for source coding with side information at the decoder," IEEE Trans. Inform. Theory, vol. 22, pp. 1-10, January 1976.

A. Wyner, "The rate-distortion function for source coding with side information at the decoder-II: general sources", Inform. Contr., vol. 38, pp. 60-80, 1978.

S. Servetto, "Lattice quantization with side information," Proc. DCC'00, Snowbird, Utah, March 2000.

X. Wang and M. Orchard, "Design of trellis codes for source coding with side information at the decoder," Proc. DCC'01, Snowbird, Utah, March 2001.

P. Mitran, and J. Bajcsy, "Coding for the Wyner-Ziv problem with turbo-like codes," Proc. ISIT'02, Lausanne, Switzerland, June/July 2002.

A. Aaron, R. Zhang and B. Girod, "Wyner-Ziv coding of motion video," Proc. 36th Asilomar Conf., Pacific Grove, Calif., November 2002.

S. Pradhan and K. Ramchandran, "Distributed source coding using syndromes (DISCUS): Design and construction," IEEE Trans. Inform. Theory, vol. 49, pp. 626-643, March 2003.

D. Rebollo-Monedero, R. Zhang, and B. Girod, "Design of optimal quantizers for distributed source coding," Proc. IEEE Data Compression Conference, Snowbird, Utah, April 2003.

J. Chou, S. Pradhan, and K. Ramchandran, "Turbo and trellis-based constructions for source coding with side information," Proc. DCC'03, Snowbird, Utah, March 2003.

A. Liveris, Z. Xiong and C. Georghiades, "Nested convolutional/turbo codes for the binary Wyner-Ziv problem," Proc. ICIP'03, Barcelona, Spain, September 2003.

Z. Xiong, A. Liveris, S. Cheng, and Z. Liu, "Nested quantization and Slepian-Wolf coding: A Wyner-Ziv coding paradigm for i.i.d. sources," Proc. IEEE Workshop on Statistical Signal Processing, St. Louis, Mo., September 2003.

Y. Yang, S. Cheng, Z. Xiong, and W. Zhao "Wyner-Ziv coding based on TCQ and LDPC codes," Proc. 37th Asilomar Conf., Pacific Grove, Calif., November 2003.

R. Zamir, S. Shamai, and U. Erez, "Nested linear/lattice codes for structured multiterminal binning," IEEE Trans. Inform. Theory, vol. 48, pp. 1250-1276, June 2002.

R. Zamir and S. Shamai, "Nested linear/lattice codes for Wyner-Ziv encoding," Proc. IEEE Information Theory Workshop, pp. 92-93, Killarney, Ireland, June 1998.

V. Tarokh, A. Vardy, and K. Zeger, "Universal Bound on the performance of lattice codes," IEEE Trans. Inform. Theory, vol. 45, pp. 670-681, March 1999.

J. H. Conway and N. J. A. Sloane, Sphere Packings. Lattices and Groups, New York: Springer, 1998.

D. Rebollo-Monedero, A. Aaron, and B. Girod "Transforms for high-rate distributed source coding," Proc. 37th Asilomar Conf., Pacific Grove, Calif., November 2003.

G. D. Forney Jr., "Coset codes-Part II: Binary lattices and related codes," IEEE Trans. Inform. Theory, vol. 34, pp. 1152-1187, 1988.

D. Slepian and J. K. Wolf, "Noiseless coding of correlated information sources," IEEE Trans. Inform. Theory, vol. 19, pp. 471-480, July 1973.

A. Gersho and R. Gray, Vector Quantization and Signal Compression, Kluwer Academic Publishers, Boston, Mass., 1992.

Lori A. Dalton, "Analysis of 1-D nested lattice quantization and Slepian-Wolf coding for Wyner-Ziv coding of i.i.d. sources", Project report for ELEN 663, Texas A&M University, May 2003.

A. Liveris, Z. Xiong and C. Georghiades, "Compression of binary sources with side information at the decoder using LDPC codes," IEEE Communications Letters, vol. 6, pp. 440-442, October 2002.

Appendices

This application includes eight appendices labeled A-H.

Appendix A comprises a paper titled: "Design of Slepian-Wolf Codes by Channel Code Partitioning" by Vladimir M. Stankovic, Angelos D. Liveris, Zixiang Xiong, and Costas N. Georghiades.

Appendix B comprises a paper titled: "On Code Design for the Slepian-Wolf Problem and Lossless Multiterminal Networks" by Vladimir M. Stankovic, Angelos D. Liveris, Zixiang Xiong, and Costas N. Georghiades.

Appendix C comprises a paper titled: "Slepian-Wolf Coded Nest Quantization (SWC-NQ) for Wyner-Ziv Coding: Performance Analysis and Code Design" by Zhixin Liu, Samuel S. Cheng, Angelos D. Liveris & Zixiang Xiong.

Appendix D comprises a paper titled: "Slepian-Wolf Coded Nested Lattice Quantization for Wyner-Ziv Coding: High Rate Performance Analysis and Code Design" by Zhixin Liu, Samuel S. Cheng, Angelos D. Liveris & Zixiang Xiong.

Appendix E comprises a paper titled: "Layered Wyner-Ziv Video Coding" by Qian Xu and Zixiang Xiong.

Appendix F comprises a paper titled: "A Turbo Code Tutorial" by William E. Ryan.

Appendix G comprises a paper titled: "Generalized Coset Codes for Symmetric Distributed Source Coding" by S. Sandeep Pradhan and Kannan Ramchandran.

Appendix H comprises a paper titled: "Compression of Binary Sources with Side Information at the Decoder Using LDPC Codes" by Angelos D. Liveris, Zixiang Xiong and Costas N. Georghiades.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

FIG. 1A—Computer System

FIG. 1A illustrates a computer system 82 operable to execute a program configured to implement any or all of the method embodiments described herein. As shown in FIG. 1A, the computer system 82 may include a display device. The display device may be operable to display a graphical user interface during execution of the program. The computer system 82 may also include a network interface (e.g., an Ethernet card) for communicating with other computers through a computer network.

The computer system 82 may include a memory medium(s) on which one or more computer programs or software components according to any subset of the method embodiments of the present invention may be stored. For example, the memory medium may store one or more programs which are executable to perform the methods described herein. The memory medium may also store operating system software, as well as other software for operation of the computer system. Various embodiments further include receiving or storing instructions and/or data implemented in accordance with the foregoing description upon a carrier medium.

Figure 1B:
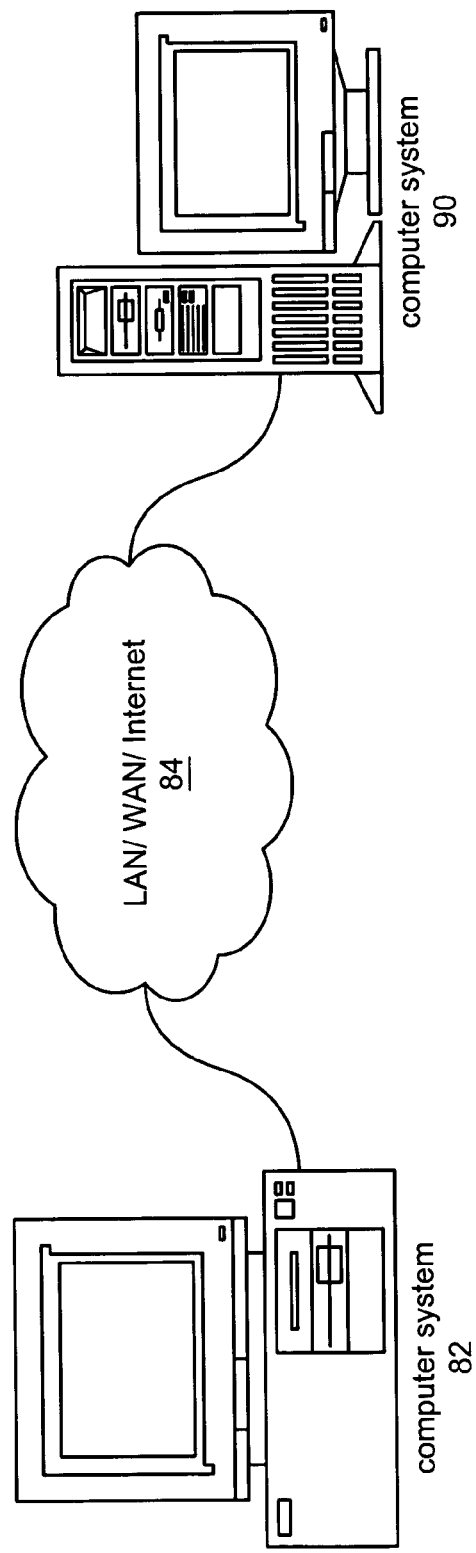
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute one or more programs in a distributed fashion.

Figure 2:
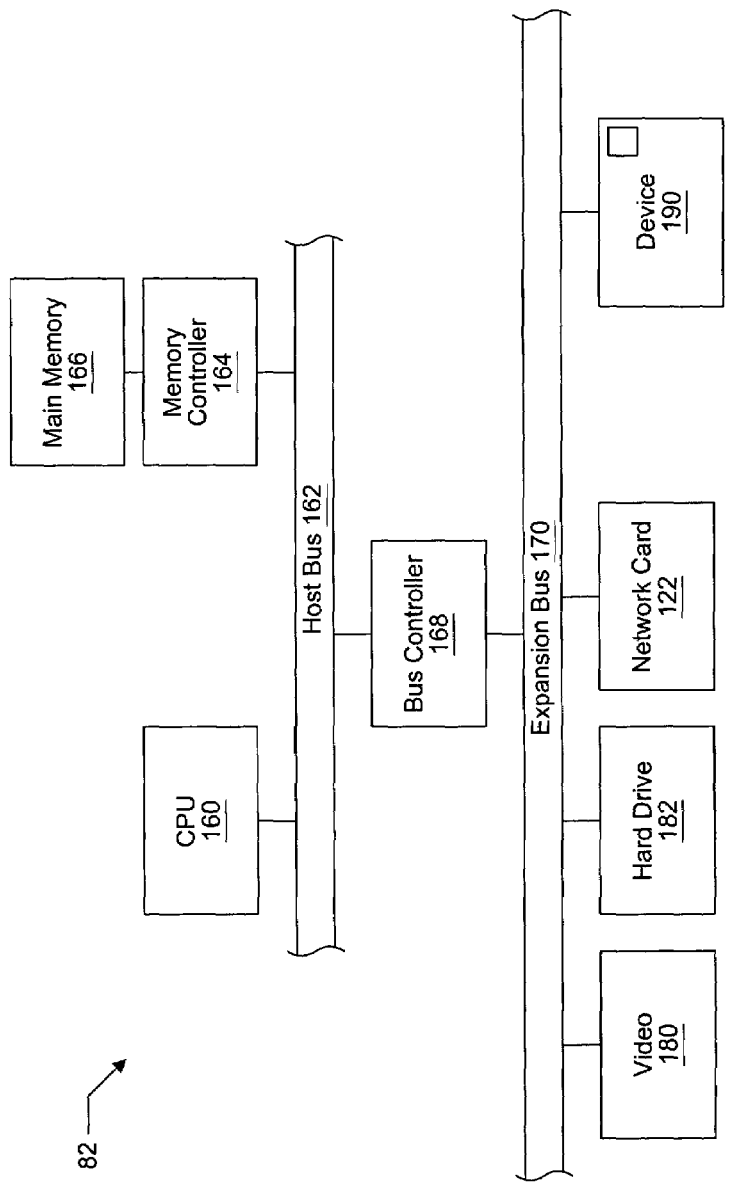
FIG. 2 is an exemplary block diagram of the computer systems of FIGS. 1A and 1B.

FIG. 2—Computer System Block Diagram

FIG. 2 is a block diagram representing one embodiment of the computer system 82 and/or 90 illustrated in FIGS. 1A and 1B. It is noted that any type of computer system configuration or architecture can be used as desired, and FIG. 2 illustrates a representative embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store programs operable to implement Wyner-Ziv encoding and/or decoder according to any of various embodiments described herein. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element (such as an FPGA). The computer system may be operable to deploy a program to the device 190 for execution of the program on the device 190.

Figure 3A:
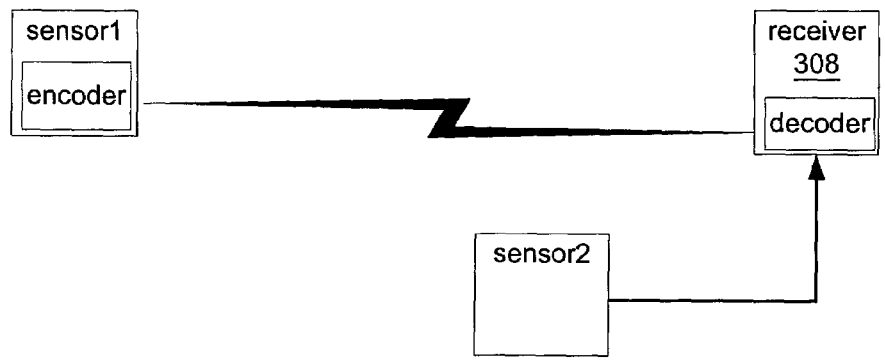
FIGS. 3A and 3B illustrate exemplary applications of the systems and methodologies described herein.
Figure 3B:
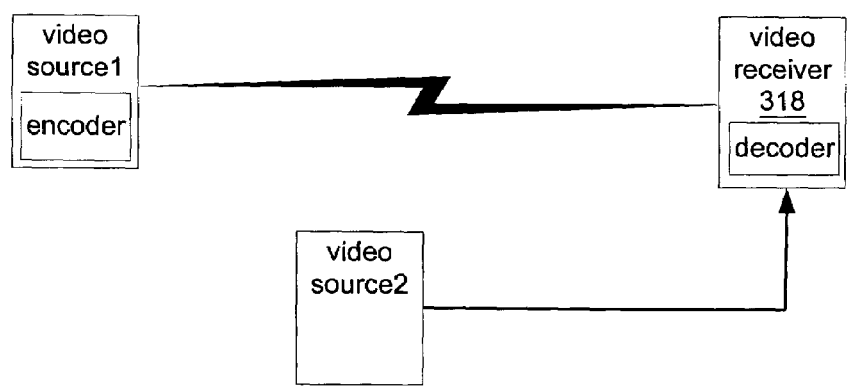

FIGS. 3A and 3B—Exemplary Systems

Various embodiments of the present invention may be directed to sensor systems, wireless or wired video transmission systems, or any other type of information processing or distribution system utilizing information coding such as Wyner-Ziv coding.

For example, as FIG. 3A shows, a receiver 308 may be operable to receive a encoded data stream from a first sensor and side information from a second sensor. As another example, a video receiver may receive an encoded video stream from a first video source and side information from a second video source. However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the audio applications, video applications, multimedia applications, any application where physical measurements are gathered, etc.

Figure 4:
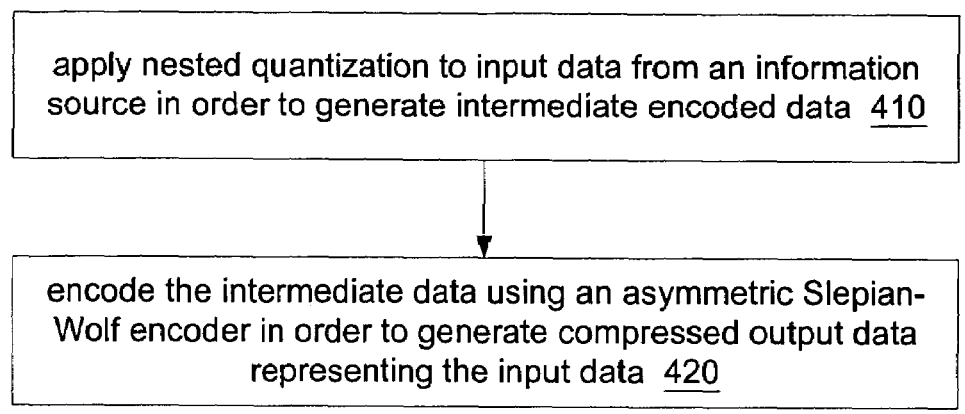
FIG. 4 is an embodiment of a method for encoding data.

FIG. 4 illustrates one embodiment of a method for realizing a Wyner-Ziv encoder. In step 410, nested quantization is applied to input data from an information source in order to generate intermediate data. In step 420, the intermediate data is encoded using an asymmetric Slepian-Wolf encoder in order to generate compressed output data representing the input data. The compressed output data may be sent to a decode unit. Steps 410 and 420 together realize a Wyner-Ziv encoder. The information source may be a continuous source or a discrete source.

The step of applying nested quantization to the input data may include: (a) quantizing values of the input data with respect to a fine lattice to determine corresponding points of the fine lattice; and (b) computing values of the intermediate data based on the fine lattice points, respectively, wherein the values of the intermediate data designate cosets of the fine lattice modulo a coarse lattice, wherein the coarse lattice $\Lambda_2$ is a sublattice of the fine lattice $\Lambda_1$.

The information source may be a source of audio information, video information, image information, text information, information derived from physical measurements, etc.

Figure 5:
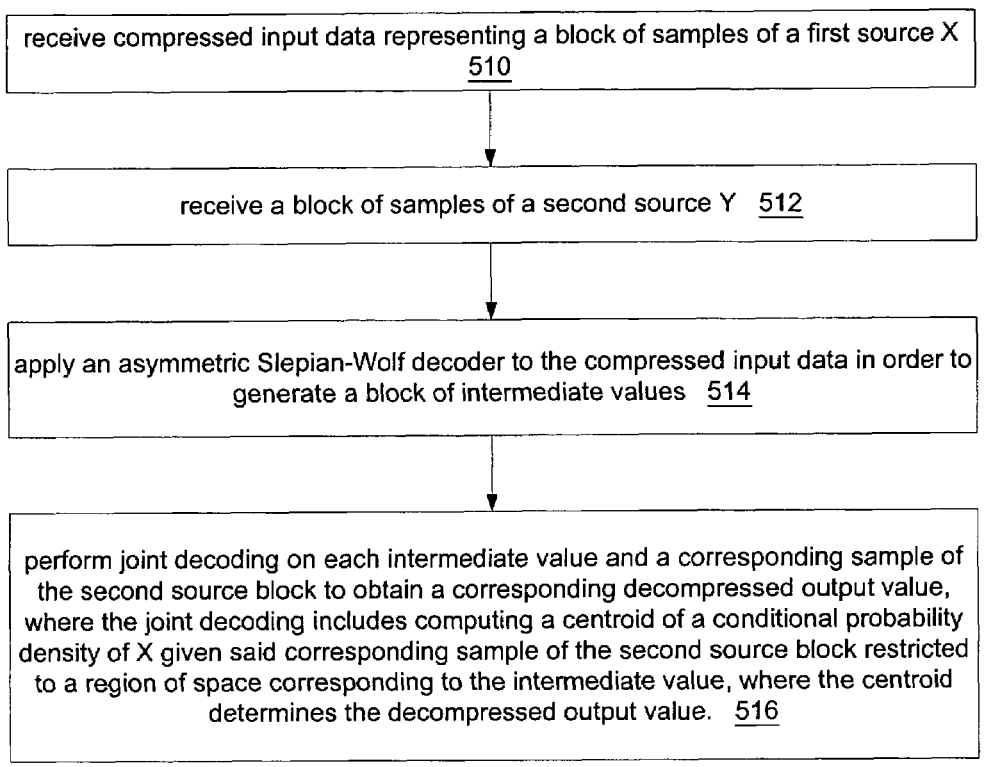
FIG. 5 is an embodiment of a method for decoding data using side information.

FIG. 5 illustrates one embodiment of a method for realizing a Wyner-Ziv decoder, the method including the following steps.

In step 510, compressed input data is received. The compressed input data represents a block of samples of a first source X. In step 512, a block of samples of a second source Y is received. Steps 510 and 512 may be performed in parallel.

In step 514, an asymmetric Slepian-Wolf decoder is applied to the compressed input data in order to generate a block of intermediate values.

In step 516, joint decoding is performed on each intermediate value and a corresponding sample of the second source block to obtain a corresponding decompressed output value. The joint decoding includes computing a centroid of a conditional probability density of the first source X given said corresponding sample of the second source block restricted to a region of space corresponding to the intermediate value, wherein the centroid determines the decompressed output value. The intermediate values specify cosets of a fine lattice with respect to a coarse lattice, wherein the coarse lattice is a sublattice of the fine lattice.

Wyner-Ziv Coding

Various embodiments of the present invention provide a new framework for Wyner-Ziv coding of independent identically distributed (i.i.d.) sources based on Slepian-Wolf coded nested quantization (SWC-NQ). The role of SWC in SWCNQ is to exploit the correlation between the quantized source and the side information for further compression and to make the overall channel code stronger. SWC-NQ generalizes the classic source coding approach of quantization (Q) and entropy coding (EC) in the sense that the quantizer performs quite well alone and can exhibit further rate savings by employing a powerful Slepian-Wolf code.

For the quadratic Gaussian case, a high-rate performance of SWC-NQ with low-dimensional nested quantization and ideal SWC has been established, and it is shown herein that SWC-NQ achieves the same performance of classic entropy-constrained lattice quantization. For example, 1-D/2-D SWC-NQ performs 1.53/1.36 dB away from the Wyner-Ziv R-D function of the quadratic Gaussian source at high rate assuming ideal SWC.

A recent work (D. Rebollo-Monedero, A. Aaron, and B. Girod "Transforms for high-rate distributed source coding," Proc. 37th Asilomar Conf., Pacific Grove, Calif., November 2003) starts with non-uniform quantization with index reuse and Slepian-Wolf coding and shows the same high-rate theoretical performance as embodiments of the present invention when the quantizer becomes an almost uniform one without index reuse. This agrees with the assertion that at high rate, the nested quantizer asymptotically becomes a non-nested regular one so that strong channel coding is guaranteed.

Embodiments implementing 1-D and 2-D nested lattice quantizers in the rate range of 1-7 bits per sample are presented. Although analysis has shown that in some embodiments nesting does not benefit at high rate, experiments using nested lattice quantizers together with irregular LDPC codes for SWC obtain performances close to the corresponding limits at low rates. Some of the embodiments presented herein thus show that SWC-NQ provides an efficient scheme for practical Wyner-Ziv coding with low-dimensional lattice quantizers at low rates.

It is noted that in some embodiments estimation in the decoder may yield significant gains only for low rates and for high rates it may not help noticeably. This is confirmed by the agreement of the high rate analysis results described herein, which assume that no estimation is used, with the high rate simulation results, for which an estimation method is always used.

Lattices and Nested Lattices

Lattices

For a set of n basis vectors $\{g_1, \ldots, g_n\}$ an unbounded n-D lattice $\Lambda$ is defined by $\Lambda = \{l = Gi: i \in \mathbb{Z}^n\}$ and its generator matrix $G = [g_1 | g_2 | \ldots | g_n]$. The nearest neighbor quantizer $Q_\Lambda(\bullet)$ associated with $\Lambda$ is given by $Q_\Lambda(x) = \arg\min_{l \in \Lambda} |x - l|$. The basic Voronoi cell of $\Lambda$, which specifies the shape of the nearest-neighbor decoding region, is $v = \{x: Q_\Lambda(x) = 0\}$. Associated with the Voronoi cell V are several important quantities: the cell volume V, the second moment $\sigma^2$ and the normalized second moment $G(\Lambda)$, defined by $$V = \int_V dx, \; \sigma^2 = \frac{1}{nV}\int_V |x|^2 dx, \text{ and } G(\Lambda) = \sigma^2 \Big/ V^{\frac{2}{n}},$$

respectively. The minimum of $G(\Lambda)$ over all lattices in $\mathbb{R}^n$ is denoted as $G_n$. By (J. H. Conway and N. J. A. Sloane, Sphere Packings. Lattices and Groups, New York: Springer, 1998), $G_n \geq \frac{1}{2\pi e}, \forall n$; and $\lim_{n \to \infty} G_n = \frac{1}{2\pi e}$.

Nested Lattices

A pair of n-D lattices $(\Lambda_1, \Lambda_2)$ with corresponding generator matrices $G_1$ and $G_2$ is nested, if there exists an n×n integer matrix P such that $G_2 = G_1 \times P$ and $\det\{P\} > 1$. In this case $V_2/V_1$ is called the nesting ratio, and $\Lambda_1$ and $\Lambda_2$ are called the fine and coarse lattice, respectively.

For a pair of nested lattices $(\Lambda_1, \Lambda_2)$, the points in the set $\Lambda_1/\Lambda_2 \triangleq \{\Lambda_1 \cap v_2\}$ are called the coset leaders of $\Lambda_2$ relative to $\Lambda_1$, where $v_2$ is the basic Voronoi cell of $\Lambda_2$. For each $v \in \Lambda_1/\Lambda_2$ the set of shifted lattice points $C(v) \triangleq \{v+l, \forall l \in \Lambda_2\}$ is called a coset of $\Lambda_2$ relative to $\Lambda_1$. The j-th point of C(v) is denoted as $c_j(v)$. Then $C(0) = \{c_j(0), \forall j \in \mathbb{Z}\} = \Lambda_2$, $\cup_{v \in \Lambda_1/\Lambda_2} C(v) = \Lambda_1$. Since $c_j(v) \in \Lambda_1, \forall_j \in \mathbb{Z}$, $R_j(v) = \{x: Q_{\Lambda_1}(x) = c_j(v)\}$ is defined as the Voronoi region associated with $c_j(v)$ in $\Lambda_1$. Then $\cup_{v \in \Lambda_1/\Lambda_2} R_0(v) = v_2$, and $\cup_{j=-\infty}^{\infty} \cup_{v \in \Lambda_1/\Lambda_2} R_j(v) = \mathbb{R}^n$, Nested Lattice Quantization Throughout the present description, the correlation model of X=Y+Z is used, where X is the source to be coded and the side information $Y \sim N(0, \sigma_Y^2)$ and the noise $Z \sim N(0, \sigma_Z^2)$ are independent Gaussian. Zamir et al.'s nested lattice quantization scheme (see R. Zamir, S. Shamai, and U. Erez, "Nested linear/lattice codes for structured multiterminal binning," IEEE Trans. Inform. Theory, vol. 48, pp. 1250-1276, June 2002; and R. Zamir and S. Shamai, "Nested linear/lattice codes for Wyner-Ziv encoding," Proc. IEEE Information Theory Workshop, pp. 92-93, Killarney, Ireland, June 1998) works as follows: Let the pseudo random vector U (the dither), known to both the quantizer encoder and the decoder, be uniformly distributed over the basic Voronoi cell $v_1$ of the fine lattice $\Lambda_1$. For a given target average distortion D, denote $$\alpha = \sqrt{1 - D/\sigma_Z^2}$$

as the estimation coeficient.

Given the realizations of the source, the side information and the dither as x, y and u, respectively, then according to R. Zamir, S. Shamai, and U. Erez, "Nested linear/lattice codes for structured multiterminal binning," IEEE Trans. Inform. Theory, vol. 48, pp. 1250-1276, June 2002, the nested quantizer encoder quantizes αx+u to the nearest point $$x_{Q_{\Lambda_1}} = Q_{\Lambda_1}(\alpha x + u) \text{ in } \Lambda_1,$$

computes $$x_{Q_{\Lambda_1}} - Q_{\Lambda_2}(x_{Q_{\Lambda_1}})$$

which is the coset shift of $$x_{Q_{\Lambda_1}}$$

with respect to $\Lambda_2$, and transmits the index corresponding to this coset shift.

The nested quantizer decoder receives $$x_{Q_{\Lambda_1}} - Q_{\Lambda_2}(x_{Q_{\Lambda_1}}),$$

forms $$w = x_{Q_{\Lambda_1}} - Q_{\Lambda_2}(x_{Q_{\Lambda_1}}) - u - \alpha y,$$

and reconstructs x as $\hat{x}=y+\alpha(w-Q_{\Lambda_2}(w))$ using linear combination and dithering in estimation.

It is shown in R. Zamir, S. Shamai, and U. Erez, "Nested linear/lattice codes for structured multiterminal binning," IEEE Trans. Inform. Theory, vol. 48, pp. 1250-1276, June 2002, that the Wyner-Ziv R-D function $D_{WZ}(R)=\sigma_{X|Y}^2 2^{-2R}$ is achievable with infinite dimensional nested lattice quantization. Presented herein, the high rate performance of low-dimensional nested lattice quantization is analyzed, which is of more practical interest as high-dimensional nested lattice quantization may currently be too complex to implement.

The analysis is based on the high-resolution assumption, which means 1) $V_1$ is small enough so that the pdf of X, $f(x)$, is approximately constant over each Voronoi cell of $\Lambda_1$ and 2) dithering can be ignored. With the high-rate assumption, $\alpha \approx 1$ and the encoder/decoder described above simplifies to 1) The encoder quantizes $$x \text{ to } x_{Q_{\Lambda_1}} = Q_{\Lambda_1}(x),$$

computes $$v = x_{Q_{\Lambda_1}} - Q_{\Lambda_2}(x_{Q_{\Lambda_1}}),$$

and transmits an index corresponding to the coset leader v.

Upon receiving v, the decoder forms w=v−y and reconstructs x as $\hat{x}_\upsilon = y+w-Q_{\Lambda_2}(w)=\upsilon+Q_{\Lambda_2}(y-\upsilon)$.

For the remainder of this description, the discuss will be limited to this simplified nested lattice quantization scheme for high rate, which was also used in S. Servetto, "Lattice quantization with side information," Proc. DCC'00, Snowbird, Utah, March 2000.

High Rate Performance

Before discussing the main results, the following Lemma is provided.

Lemma 1: If a pair of n-D nested lattices $(\Lambda_1,\Lambda_2)$ with nesting ratio $N=V_2=V_1$ is used for nested lattice quantization, the distortion per dimension in Wyner-Ziv coding of X with side information Y at high rate is $$D_n = G(\Lambda_1)V_1^{\frac{2}{n}} + \frac{1}{n}E_Z[\|Q_{\Lambda_2}(Z)\|^2]. \qquad (1)$$

Proof: The average distortion for a given realization of the side information Y=y is $$D(y) = \sum_{\upsilon \in \Lambda_1/\Lambda_2} \sum_{j=-\infty}^{\infty} \int_{x \in R_j(\upsilon)} f(x|y)\|x-\hat{x}_\upsilon\|^2 dx = \qquad (2)$$

$$\sum_{\upsilon \in \Lambda_1/\Lambda_2} \sum_{j=-\infty}^{\infty} \int_{x \in R_j(\upsilon)} f(x|y)\|x - c_j(\upsilon) + c_j(\upsilon) - \hat{x}_\upsilon\|^2 dx =$$

$$\sum_{\upsilon \in \Lambda_1/\Lambda_2} \sum_{j=-\infty}^{\infty} \int_{x \in R_j(\upsilon)} f(x|y)[\|x - c_j(\upsilon)\|^2 + \|c_j(\upsilon) - \hat{x}_\upsilon\|^2 + 2 <$$

$$x - c_j(\upsilon), c_j(\upsilon) - \hat{x}_\upsilon >]dx \stackrel{(a)}{\approx}$$

$$\sum_{\upsilon \in \Lambda_1/\Lambda_2} \sum_{j=-\infty}^{\infty} \left[ f(c_j(\upsilon)|y) \int_{x \in R_j(\upsilon)} \|x - c_j(\upsilon)\|^2 dx + \right.$$

$$\left. \int_{x \in R_j(\upsilon)} f(x|y)\|c_j(\upsilon) - \hat{x}_\upsilon\|^2 dx \right] \stackrel{(b)}{=}$$

$$\sum_{\upsilon \in \Lambda_1/\Lambda_2} \sum_{j=-\infty}^{\infty} \left[ f(c_j(\upsilon)|y) n G(\Lambda_1) V_1^{1+\frac{2}{n}} + \int_{x \in R_j(\upsilon)} f(x|y) \right.$$

$$\left. \|Q_{\Lambda_2}(c_j(\upsilon)) - Q_{\Lambda_2}(y - c_j(\upsilon) + Q_{\Lambda_2}(c_j(\upsilon)))\|^2 dx \right] \stackrel{(c)}{\approx}$$

$$nG(\Lambda_1)V_1^{\frac{2}{n}} + \sum_{j=-\infty}^{\infty} \sum_{\upsilon \in \Lambda_1/\Lambda_2} \int_{x \in R_j(\upsilon)} f(x|y)\|Q_{\Lambda_2}(x-y)\|^2 dx, =$$

$$nG(\Lambda_1)V_1^{\frac{2}{n}} + \int_{x \in R^n} f(x|y)\|Q_{\Lambda_2}(x-y)\|^2 dx,$$

where (a) comes from the high resolution assumption and $\int_{x \in R_j(\upsilon)} <x-c_j(\upsilon),c_j(\upsilon)-\hat{x}_\upsilon>dx=0$. The latter is due to the fact that $x-c_j(\upsilon)$ is odd spherical symmetric for $x \in R_j(\upsilon)$ and both $c_j(\upsilon)$ and $\hat{x}_\upsilon$ are fixed for $x \in R_j(\upsilon)$ with given $\upsilon$ and y, b) is due to $c_j(\upsilon)=Q_{\Lambda_1}(x)$ for $x \in R_j(\upsilon)$, and $\hat{x}_\upsilon = c_j(\upsilon)-Q_{\Lambda_2}(c_j(\upsilon))+Q_{\Lambda_2}(y-c_j(\upsilon)+Q_{\Lambda_2}(c_j(\upsilon)))$, and (c) is because of $Q_{\Lambda_2}(a-Q_{\Lambda_2}(b))=Q_{\Lambda_2}(a)+Q_{\Lambda_2}(b)$, $\forall a,b \in \mathbb{R}^n$ and the high resolution assumption.

Therefore, the average distortion per dimension over all realizations of Y is $$D_n = \frac{1}{n}E_Y[D(y)] = G(\Lambda_1)V_1^{\frac{2}{n}} + \frac{1}{n}E_Z[\|Q_{\Lambda_2}(z)\|^2] \quad (3)$$

Note that for a fixed pair of nested lattices $(\Lambda_1, \Lambda_2)$, $D_n$, only depends on Z, i.e, the correlation between X and Y. It is independent of the marginal distribution of X (and Y). The first term, $$G(\Lambda_1)V_1^{\frac{2}{n}},$$

in the $D_n$ is due to lattice quantization in source coding. It is determined by the geometric structure and the Voronoi cell's volume of $\Lambda_1$. The second term, $$\frac{1}{n}E_Z[\|Q_{\Lambda_2}(z)\|^2],$$

is the loss due to nesting (or the channel coding component of the nested lattice code). It depends on $V_2$ and the distribution of Z. From Lemma 1, the lower bound of the high-rate R-D performance of low dimensional nested lattice quantizers for Wyner-Ziv coding may be obtained, when Z is Gaussian.

Theorem 1: For $X=Y+Z$, $Y\sim N(0,\sigma_Y^2)$ and $Z\sim N(0,\sigma_Z^2)$, the R-D performance of Wyner-Ziv coding for X with side information Y using n-D nested lattice quantizers is lower-bounded at high rate by $$D_n(R) \geq \overline{D}_n(R) \triangleq \min_{V_2>0} \delta_n(R), \quad (4)$$

$$\delta_n(R) \triangleq G_n V_2^{\frac{2}{n}} 2^{-2R} + \frac{1}{n}\sum_{j=1}^{\infty}\left((2j-1)\gamma_n V_2^{\frac{2}{n}}\right)u\left(\frac{j^2 V_2^{\frac{2}{n}}\Gamma(\frac{n}{2}+1)^{\frac{2}{n}}}{2\pi\sigma_Z^2}\right) \quad (5)$$

where $\gamma_n$ is the n-D Hermite's constant (see J. H. Conway and N. J. A. Sloane, Sphere Packings. Lattices and Groups, New York: Springer, 1998; and V. Tarokh, A. Vardy, and K. Zeger, "Universal Bound on the performance of lattice codes," IEEE Trans. Inform. Theory, vol. 45, pp. 670-681, March 1999), and u(t) is defined in V. Tarokh, A. Vardy, and K. Zeger, "Universal Bound on the performance of lattice codes," IEEE Trans. Inform. Theory, vol. 45, pp. 670-681, March 1999, as $$u(t) \triangleq \begin{cases} e^t\left(1 + \frac{t}{1!} + \frac{t^2}{2!} + \ldots + \frac{t^{\frac{n}{2}-1}}{(\frac{n}{2}-1)!}\right) & \text{if } n \text{ is even,} \\ e^t\left(1 + \frac{t^{1/2}}{(1/2)!} + \frac{t^{3/2}}{(3/2)!} + \ldots + \frac{t^{\frac{n}{2}-1}}{(\frac{n}{2}-1)!}\right) & \text{if } n \text{ is odd.} \end{cases} \quad (6)$$

Specifically, when n=1, the best possible high rate performance is $$D_1(R) = \min_{V_2>0}\left\{G_1 V_2^2 2^{-2R} + V_2^2 \sum_{j=0}^{\infty}(2j+1)Q\left(\frac{V_2}{\sigma_Z}\left(j+\frac{1}{2}\right)\right)\right\} \quad (7)$$

where $$Q(x) = \frac{1}{\sqrt{2\pi}}\int_x^{\infty} e^{-z^2/2}dz.$$

Proof:
1) Rate computation: Note that the nested lattice quantizer is a fixed rate quantizer with rate $$R = \frac{1}{n}\log_2(V_2/V_1).$$

2) Distortion computation: Define $$L_2 = \frac{1}{2}\min_{\forall l,l' \in \Lambda_2, l \neq l'} \|l - l'\|,$$

and $P_Z(L) = \Pr(\|Z\| > L)$.

In the 1-D (scalar) case, $P_Z$ can be expressed in term of the Q function and $E_Z[\|Q_{\Lambda_2}(z)\|^2]$ simplifies to (see Lori A. Dalton, "Analysis of 1-D nested lattice quantization and Slepian-Wolf coding for Wyner-Ziv coding of i.i.d. sources", Project report for ELEN 663, Texas A&M University, May 2003):

$$E_Z[\|Q_{\Lambda_2}(z)\|^2] = V_2^2 \sum_{j=0}^{\infty}(2j+1)Q\left(\frac{V_2}{\sigma_Z}\left(j+\frac{1}{2}\right)\right) \quad 8)$$

In the n-D (n>1) case, note that $$L_2^2 = \gamma(\Lambda_2)V(\Lambda_2)^{\frac{2}{n}}[18] \text{ and } \|Q_{\Lambda_2}(z)\|^2 \geq$$
$$\|z\|^2 - \|z - Q_{\Lambda_2}(z)\|^2 \geq \|z\|^2 - L_2^2$$

(see G. D. Forney Jr., "Coset codes-Part II: Binary lattices and related codes," IEEE Trans. Inform. Theory, vol. 34, pp. 1152-1187, 1988). From V. Tarokh, A. Vardy, and K. Zeger, "Universal Bound on the performance of lattice codes," IEEE Trans. Inform. Theory, vol. 45, pp. 670-681, March 1999, one gets $$E_Z[\|Q_{\Lambda_2}(z)\|^2] = \sum_{j=1}^{\infty}\|Q_{\Lambda_2}(z)\|^2 P_r((j-1)L_2 < \|z\| \leq jL_2) \geq \quad (9)$$
$$\sum_{j=1}^{\infty}(\|z\|^2 - L_2^2)[P_Z((j-1)L_2) - P_Z(jL_2)] \geq$$

-continued $$\sum_{j=1}^{\infty}((j-1)^2L_2^2 - L_2^2)[P_Z((j-1)L_2) - P_Z(jL_2)] =$$

$$\sum_{j=1}^{\infty}((2j-1)L_2^2)P_Z(jL_2) =$$

$$\sum_{j=1}^{\infty}\left[(2j-1)\gamma(\Lambda_2)V_2^{\frac{2}{n}}\right]P_e\left(\frac{j^2V_2^{\frac{2}{n}}\Gamma\left(\frac{n}{2}+1\right)^{\frac{2}{n}}}{2\pi\sigma_Z^2}\right),$$

where $\Lambda(t) = \int_0^\infty u^{t-1}e^{-u}du$ is Euler's gamma function, $\gamma(\Lambda_2)$ is the Hermite's constant of lattice $\Lambda_2$ (see J. H. Conway and N. J. A. Sloane, Sphere Packings. Lattices and Groups, New York: Springer, 1998; and V. Tarokh, A. Vardy, and K. Zeger, "Universal Bound on the performance of lattice codes," IEEE Trans. Inform. Theory, vol. 45, pp. 670-681, March 1999), and $P_e(\cdot)$ is defined in V. Tarokh, A. Vardy, and K. Zeger, "Universal Bound on the performance of lattice codes," IEEE Trans. Inform. Theory, vol. 45, pp. 670-681, March 1999, as the symbol error probability under maximum-likelihood decoding while transmitting the lattice points $\upsilon \in \Lambda$ over an AWGN channel. A lower bound of $P_e(\cdot)$ was also given as $P_e(t) \geq u(t)$.

Then Lemma 1 and (9) give $$D_n \geq \delta_n \triangleq G_n V_1^{\frac{2}{n}} + \frac{1}{n}\sum_{j=1}^{\infty}\left((2j-1)\gamma_n V_2^{\frac{2}{n}}\right)u\left(\frac{j^2 V_2^{\frac{2}{n}}\Gamma\left(\frac{n}{2}+1\right)^{\frac{2}{n}}}{2\pi\sigma_Z^2}\right) \quad (10)$$

Using $$R = \frac{1}{n}\log_2(V_2/V_1), V_i$$

may be eliminated in $D_n$ and a lower bound obtained of $$D_n(R) \geq \overline{D}_n(R) \triangleq \min_{V_2 > 0} \delta_n(R) \quad (11)$$

where $$\delta_n(R) = \quad (12)$$

$$G_n V_2^{\frac{2}{n}} 2^{-2R} + \frac{1}{n}\sum_{j=1}^{\infty}\left((2j-1)\gamma_n V_2^{\frac{2}{n}}\right)u\left(\frac{j^2 V_2^{\frac{2}{n}}\Gamma\left(\frac{n}{2}+1\right)^{\frac{2}{n}}}{2\pi\sigma_Z^2}\right)$$

FIG. 1 of Appendix C (a) shows $\delta_2(R)$ with different $V_2$'s using nested $A_2$ lattices in 2-D with $\sigma_Z^2 = 0.01$. The lower bound $\overline{D}_2(R)$ is the lower convex hull of all operational R-D points with different $V_2$ in the figure. FIG. 1(b) of Appendix C plots $\overline{D}_n(R)$ for n=1,2,4,8 and 24 with $\sigma_Z^2 = 0.01$. It may be seen that $\overline{D}_n(R)$ converges to the Wyner-Ziv R-D function $D^{WZ}(R) = \sigma_{X|Y}^2 2^{-2R}$ as n goes to infinity. It may also be observed from FIG. 1(b) of Appendix C that the gap from $\overline{D}_n(R)$ to $D_{WZ}(R)$ in dBs keeps increasing as rate increases with $\sigma_Z^2 = 0.01$.

Regarding FIG. 1 of Appendix C note that:

FIG. 1 of Appendix C: (a) $\delta_2(R)$ with different $V_2$'s in the 2-D case. (b) The lower bound $\overline{D}(R)$ of $D_n(R)$ for different dimensions, with $\sigma_Z^2 = 0.01$.

Slepian-Wolf Coded Nested Lattice Quantization (SWC-NQ)

Motivation of SWC-NQ

The performance of lattice source codes and lattice channel codes are analyzed in V. Tarokh, A. Vardy, and K. Zeger, "Universal Bound on the performance of lattice codes," IEEE Trans. Inform. Theory, vol. 45, pp. 670-681, March 1999, and J. H. Conway and N. J. A. Sloane, Sphere Packings. Lattices and Groups, New York:Springer, 1998, respectively. In the 1-D nested scalar quantizer, the source code $\Lambda_1$ performs 1.53 dB (see J. H. Conway and N. J. A. Sloane, Sphere Packings. Lattices and Groups, New York: Springer, 1998; and A. Gersho and R. Gray, Vector Quantization and Signal Compression, Kluwer Academic Publishers, Boston, Mass., 1992) worse than the R-D function at high rate, whereas the channel code $\Lambda_2$ suffers more than 6.5 dB loss with respect to the channel capacity in terms of channel SNR (with $P_e = 10^6$) (see V. Tarokh, A. Vardy, and K. Zeger, "Universal Bound on the performance of lattice codes," IEEE Trans. Inform. Theory, vol. 45, pp. 670-681, March 1999). As the dimensionality increases, lattice source codes reach the R-D function much faster than the lattice channel codes approach the capacity. This explains the increasing gap between $\overline{D}_n(R)$ and $D_{WZ}(R)$ in FIG. 1(b) of Appendix C as the rate increases.

Consequently one needs channel codes of much higher dimension than source codes to achieve the same loss, and the Wyner-Ziv limit should be approached with nesting codes of different dimensionality in practice.

Thus a framework is proposed for Wyner-Ziv coding of i.i.d. sources based on SWC-NQ, which is NQ followed by SWC. Despite the fact that there is almost no correlation among the nested quantization indices that identify the coset leaders $\upsilon \in \Lambda_1/\Lambda_2$ of the pair of nested lattices $(\Lambda_1, \Lambda_2)$, there still remains correlation between $\upsilon$ and the side information Y. Ideal SWC can be used to compress $\upsilon$ to the rate of $R = H(\upsilon|Y)$. In practice, it has already been made clear that SWC is a channel coding problem (see R. Zamir, S. Shamai, and U. Erez, "Nested linear/lattice codes for structured multiterminal binning," IEEE Trans. Inform. Theory, vol. 48, pp. 1250-1276, June 2002). State-of-the-art channel codes, such as LDPC codes, can be used to approach the Slepian-Wolf limit $H(\upsilon|Y)$ (see A. Liveris, Z. Xiong and C. Georghiades, "Compression of binary sources with side information at the decoder using LDPC codes," IEEE Communications Letters, vol. 6, pp. 440-442, October 2002). The role of SWC in SWC-NQ is to exploit the correlation between $\upsilon$ and Y for further compression, thus making the overall channel code stronger.

High Rate Performance

For the quadratic Gaussian case, the high-rate performance of SWC-NQ using low-dimensional nested lattices is given in this section. Start with the following Lemma.

Lemma 2: The R-D performance of ideally Slepian-Wolf coded nested lattice quantization at high rate using a low-dimensional nested lattice pair ($\Lambda_1$:$\Lambda_2$) is $$D_n(R) = G(\Lambda_1)2^{\frac{2}{n}h'(X,\Lambda_2)}\sigma_{X|Y}^2 2^{-2R} + \frac{1}{n}E_Z[\|Q_{\Lambda_2}(z)\|^2] \quad (13)$$

where $h'(X, \Lambda) \triangleq -\int_{x \in R^n} \tilde{f}(x)\log_2[\Sigma_{i=-\infty}^{\infty}\tilde{f}(x+c_i(0)/\sigma_{X|Y})]dx$, and $\tilde{f}(\bullet)$ is the pdf of an n-D i.i.d. Gaussian source with 0 mean and unit variance, and $c_i(0)$ is defined above in the section Nested Lattices.

Proof:

1) Rate Computation: The rate for SWC-NQ is: $R=1/nH(\upsilon|Y)$. Since at high rate, $$P(\upsilon|Y) = \sum_{j=-\infty}^{\infty}\int_{x \in R_j(\upsilon)} f_{X|Y}(x)dx$$

$$= \sum_{j=-\infty}^{\infty}\int_{x \in R_0(\upsilon)} f_{X|Y}(x+c_j(0))dx$$

$$\approx \sum_{j=-\infty}^{\infty} f_{X|Y}(\upsilon+c_j(0))V_1 \triangleq g(\upsilon)V_1,$$

where $g(x) \triangleq \Sigma_{j=-\infty}^{\infty} f_{X|Y}(x+c_j(0))$, and $X|Y \sim N(0,\sigma_{X|Y}^2)$. Then the achievable rate of SWC-NQ is $$nR = H(\upsilon|Y) \approx -\sum_{\upsilon \in \Lambda_1/\Lambda_2} P(\upsilon|Y)\log_2[g(\upsilon)V_1]$$

$$= -\sum_{\upsilon \in \Lambda_1/\Lambda_2}\sum_{j=-\infty}^{\infty}\int_{x \in R_0(\upsilon)} f_{X|Y}(x+c_j(0))dx\log_2 g(\upsilon) - \log_2 V_1$$

$$\approx -\sum_{j=-\infty}^{\infty}\sum_{\upsilon \in \Lambda_1/\Lambda_2}\int_{x \in R_0(\upsilon)} f_{X|Y}(x+c_j(0))\log_2 g(x)dx - \log_2 V_1$$

$$\stackrel{(a)}{=} -\int_{x \in R^n} f_{X|Y}(x)\log_2 g(x)dx - \log_2 V_1$$

where (a) comes from the periodic property of $g(\bullet)$, i.e. $g(x-l|y)=g(x|y), \forall l \in \Lambda_2$.

Thus the achievable rate of SWC-NQ is $$nR = H(\upsilon|Y) = h'(X,\Lambda_2) + \log_2 \sigma_{X|Y}^n - \log_2 V_1 \quad (14)$$

2) Distortion Computation: From Lemma 1, the average distortion of nested lattice quantization over all realizations of $$(X, Y) \text{ is } D_n = G(\Lambda_1)V_1^{\frac{2}{n}} + \frac{1}{n}E_Z[\|Q_{\Lambda_2}(z)\|^2].$$

Because SWC is lossless, the distortion of SWC-NQ is also $D_n$. Combining $D_n$ and R through $V_1$, the R-D performance may be obtained of SWC-NQ with a pair of n-D nested lattice $(\Lambda_1, \Lambda_2)$ as $$D_n(R) = G(\Lambda_1)2^{\frac{2}{n}h'(X,\Lambda_2)}\sigma_{X|Y}^2 2^{-2R} + \frac{1}{n}E_Z[\|Q_{\Lambda_2}(z)\|^2] \quad (15)$$

Based on Lemma 2, a search may be made for the optimal $V_2$ to minimize $D_n(R)$, and the following theorem presented. Due to space limitations, only a high-level discussion of the proof is presented herein.

Theorem 2: For the quadratic Gaussian case, the R-D performance of SWC-NQ using low-dimensional nested lattices for Wyner-Ziv coding at high rate is $$D_n(R) = 2\pi e G_n \sigma_{X|Y}^2 2^{-2R} \quad (16)$$

Sketch of the proof: If (15) is rewritten as $$D_n(R) = 2\pi e G(\Lambda_1)\sigma_{X|Y}^2 2^{-2(R+\frac{1}{2}\log_2(2\pi e)-\frac{1}{n}h'(X_1\Lambda_2))} + \quad (17)$$

$$\frac{1}{n}E_Z[\|Q_{\Lambda_2}(z)\|^2]$$

$$= 2\pi e G(\Lambda_1)\sigma_{X|Y}^2 2^{-2(R+\frac{1}{n}(h(X)-h'(X,\Lambda_2)))} +$$

$$\frac{1}{n}E_Z[\|Q_{\Lambda_2}(z)\|^2]$$

$$\triangleq 2\pi e G(\Lambda_1)\sigma_{X|Y}^2 2^{-2(R+\Delta R)} + \Delta D,$$

and compare (17) with $2\pi e G(\Lambda_1)\sigma_{X|Y}^2 2^{-2R}$, it is found that $D_n(R)$ for SWC-NQ has an extra distortion $$\Delta D \triangleq \frac{1}{n}E_Z[\|Q_{\Lambda_2}(z)\|^2]$$

with a rate saving $$\Delta R \triangleq \frac{1}{n}(h(X) - h'(X, \Lambda_2)))$$

due to nesting. FIG. 2 of Appendix C shows $\Delta D$ and $\Delta R$ as functions of $V_2$ for $n=2$ and $\sigma_Z^2=0.01$. By the definition of $h'(\bullet)$, $\Delta R$ and $\Delta D$ go to zero as $V_2$ goes to infinity. Thus $$\lim_{V_2 \to \infty} D_n(R) = 2\pi e G(\Lambda_1)\sigma_{X|Y}^2 2^{-2R} \quad (18)$$

It may thus be concluded for the quadratic Gaussian source and at high rate, SWC-NQ performs the same as traditional entropy-constrained lattice quantization with side information available at both the encoder and decoder. Specifically, the R-D functions with 1-D (scalar) lattice and 2-D (hexagonal) lattice are 1.53 dB and 1.36 dB away from the Wyner-Ziv bound, respectively.

Regarding FIG. 2 of Appendix C note that: The extra distortion $$\Delta D = \frac{1}{n}E_Z[\|Q_{\Lambda_2}(z)\|^2]$$

and the rate saving $$\Delta R = \frac{1}{n}(h(X) -$$

due to nesting as a function of $V_2$, for $n=2$ and $\sigma_Z^2=0.01$.

Remarks: It has been found that for finite rate R and small n (e.g., n=1 and 2), the optimal $V_2$, denoted as $V^*_2$, that minimizes the distortion $D_n(R)$ in (15) is also finite. FIG. 3 of Appendix C plots the optimal $V_2^*$ (scaled by $\sigma_Z$) as a function of R in the 1-D case (n=1). It may be seen that as R goes to infinity, $V_2^*$ also goes to infinity, showing consistency with (18). It may also be observed that for fixed R and n, $D_n(R)$ stays roughly constant for $V_2 > V_2^*$. Regarding FIG. 3 of Appendix C note that: $V_2^*/\sigma_Z$ vs. R computed from (15) for n=1.

Code Design and Simulation Results

Slepian-Wolf coding can be implemented using syndrome coding based on the most powerful channel codes available, such as LDPC codes and/or turbo codes. Let $J(0 \leq J \leq N-1)$ denote the index of the coset leader υ, one needs to code J using Slepian-Wolf codes with Y as the side information. Instead of coding J as a whole, J may be coded bit-by-bit using the multi-layer Slepian-Wolf coding. Assume $J = (B_m B_{m-1} \ldots B_2 B_1)_2$, where $B_m$ is the most significant bit (MSB) of J, and $B_1$ is the least significant bit (LSB). At first $B_1$ is coded using a Slepian-Wolf code with Y as side information at rate $R_1 = H(B_1|Y)$; then $B_2$ is coded with side information $R_2 = H(B_2|Y, B_1)$; . . . ; $B_m$ is coded with side information $\{Y, B_1, B_2, \ldots, B_{m-1}\}$ at rate $R_m = H(B_m|Y, B_1, \ldots B_{m-1})$. Hence the total rate is $H(J|Y) = H(\upsilon|Y)$.

Estimation at the decoder plays an important role for low-rate implementation. Thus, an optimal non-linear estimator may be applied at the decoder at low rates in simulations. This estimator degenerates to a linear one at high rates. 1-D nested lattice quantizer design was performed for different sources with $10^6$ samples of X in each case. For $\sigma_Y^2 = 1$ and $\sigma_Z^2 = 0.01$, FIG. 4 of Appendix C shows results with nested lattice quantization alone and SWC-NQ. The former exhibits a 3.95-9.60 dB gap from $D_{WZ}(R)$ for R=1.0-7.0 b/s, which agrees with the high rate lower bound of Theorem 1. At high rate, it may be observed that the gap between results with ideal SWC (i.e., rate computed as $H(J|Y)$ in the simulation) and $D_{WZ}(R)$ is indeed 1.53 dB. With practical SWC based on irregular LDPC codes of length $10^6$ bits, this gap is 1.66-1.80 dB for R=0.93-5.00 b/s.

For 2-D nested lattice quantization, the $A_2$ hexagonal lattices may be used again with $\sigma_Y^2 = 1$, $\sigma_Z^2 = 0.01$. FIG. 4 of Appendix C also shows results with nested lattice quantization alone and SWC-NQ.

At high rate, the former case exhibits a 4.06-8.48 dB gap from $D_{WZ}(R)$ for R=1.40-5.00 b/s, again in agreement with the high rate lower bound of Theorem 1. It may be observed that the gap between results with ideal SWC (measured in the simulation) and $D_{WZ}(R)$ is 1.36 dB. With practical SWC based on irregular LDPC codes (of length $10^6$ bits), this gap is 1.67-1.72 dB for R=0.95-2.45 b/s.

It may thus be seen that using optimal estimation, simulation results with either 1-D or 2-D nested quantization (and practical Slepian-Wolf coding) are almost a constant gap away from the Wyner-Ziv limit for a wide range of rates.

FIG. 4 of Appendix C: Results based on 1-D nested lattice quantization and 2-D nested $\Lambda_2$ lattice quantization with and without SWC.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for realizing a Wyner-Ziv encoder, the method comprising:

applying a 2-dimensional nested lattice quantization to input data from an information source in order to generate intermediate data, wherein cell volume of a coarse lattice of the 2-dimensional nested lattice quantization is optimized to minimize a rate distortion; and encoding the intermediate data using an asymmetric Slepian-Wolf encoder in order to generate compressed output data representing the input data.

2. The method of claim 1, wherein said applying the 2-dimensional nested lattice quantization to the input data includes:

quantizing values of the input data with respect to a fine lattice to determine corresponding points of the fine lattice; and computing values of the intermediate data based on the fine lattice points, respectively, wherein the values of the intermediate data designate cosets of the fine lattice modulo the coarse lattice, wherein the coarse lattice $\Lambda 2$ is a sublattice of the fine lattice $\Lambda 1$.

3. The method of claim 1 further comprising:

sending the compressed output data to a decode unit.

4. The method of claim 1, wherein the information source is a source of audio information source, a source of video information, a source of image information, or a source of text information.

5. The method of claim 1, wherein the information source is a continuous source.

6. The method of claim 1, wherein the information source is a discrete source.

7. A method for realizing a Wyner-Ziv decoder, the method comprising:

(a) receiving compressed input data representing a block of samples of a first source X;

(b) receiving a block of samples of a second source Y;

(c) applying an asymmetric Slepian-Wolf decoder to the compressed input data, using the block of samples of the second source Y, in order to generate a block of intermediate values;

(d) performing joint decoding on each intermediate value and a corresponding sample of the second source block to obtain a corresponding decompressed output value, wherein said performing joint decoding includes computing a centroid of a conditional probability density of the first source X given said corresponding sample of the second source block restricted to a region of space corresponding to the intermediate value, wherein the centroid determines the decompressed output value.

8. The method of claim 7, wherein the intermediate values specify cosets of a fine lattice with respect to a coarse lattice, wherein the coarse lattice is a sublattice of the fine lattice.

9. The method of claim 7, wherein (a) and (b) are performed in parallel.

* * * * *